United States Patent [19]

Thylén et al.

[11] Patent Number: 4,511,206
[45] Date of Patent: Apr. 16, 1985

[54] LENSLESS SPECTRUM ANALYZER

[75] Inventors: Lars Thylén, Huddinge; Leif Stensland, Järfälla; Gunnar Arvidsson, Stockholm, all of Sweden

[73] Assignee: Institutet for Optisk Forskning, Stockholm, Sweden

[21] Appl. No.: 457,109

[22] PCT Filed: Apr. 26, 1982

[86] PCT No.: PCT/SE82/00137
§ 371 Date: Dec. 20, 1982
§ 102(e) Date: Dec. 20, 1982

[87] PCT Pub. No.: WO82/03912
PCT Pub. Date: Nov. 11, 1982

[30] Foreign Application Priority Data

Apr. 27, 1981 [SE] Sweden .................. 8102671

[51] Int. Cl.$^3$ .............................. G02B 5/174
[52] U.S. Cl. ................ 350/96.11; 324/77 K; 350/96.14
[58] Field of Search ........... 324/77 K; 350/96.11, 350/96.12, 96.13, 96.14

[56] References Cited

U.S. PATENT DOCUMENTS

| 3,997,687 | 12/1976 | Phillips | 427/12 |
|---|---|---|---|
| 4,274,049 | 6/1981 | Stoll | 324/77 K |
| 4,403,825 | 9/1983 | Tangonan et al. | 350/96.11 |
| 4,418,980 | 12/1983 | Keil et al. | 350/96.13 |
| 4,440,468 | 4/1984 | Auracher et al. | 350/96.12 |

OTHER PUBLICATIONS

Thylén et al., *IEEE J. on Quantum Electronics,* vol. QE-18, No. 3, Mar. 1982, "Lensless Integrated Optics Spectrum Analyzer", pp. 381-385.
Thylén et al., *Applied Optics,* vol. 20, No. 10, May 15, 1981, "Electrooptic Approach to an Integrated Optics Spectrum Analyzer", pp. 1825-1832.
Takizawa, *Optics Communications,* vol. 37, No. 5, Jun. 1981, "Fresnel Light Modulator with an Array of Channel Waveguides", pp. 345-348.
Wright et al., *Electronics Letters,* vol. 10, No. 24, Nov. 28, 1974, "High Speed Electrooptic Analogue Digital Conversion", pp. 508-509.
DeBarros et al., *Electronics Letters,* vol. 7, No. 10, May 20, 1971, "Nanosecond Baseband Optical-Diffraction Modulator", pp. 267-269.

*Primary Examiner*—William L. Sikes
*Assistant Examiner*—Frank González
*Attorney, Agent, or Firm*—Pollock, Vande Sande & Priddy

[57] ABSTRACT

The present invention relates to a lensless spectrum analyzer, preferably of integrated optical type, with a radiation source (1) connected to a waveguide (2) which is connected to an electro-optical deflector (3), exploiting Pockel's effect. The radiation from the deflector (3) is guided by the waveguide (2) on to a detection matrix (4). The electro-optical deflector (3) then consists of an electrode matrix (5) with the electrodes (6-11) arranged in or in the vicinity of an electro-optically active material (21). The electrodes (6-11) which are of different widths and are disposed at different distances from each other are arranged along a line (18) which is largely disposed at right angle to the incident radiation. By this means, the deflector acquires lens properties and can perform the desired Fourier transformation of the electric signal connected to the deflector (3). In the course of this transformation, the incident radiation is divided up into bundles of rays representing different Fourier components and focused along a focal line (20) along which the detection matrix (4) is arranged. Since the deflector possesses lens properties, it becomes possible to elaborate the entire device according to the invention in integrated form, enabling the device to be manufactured in its entirety by application of photolithographic technology.

7 Claims, 4 Drawing Figures

LENSLESS SPECTRUM ANALYZER

The present invention relates to an integrated optical spectrum analyzer for analysis of the spectral content of an electric signal.

The advantage of using optical signal processing is that it affords the possibility of detecting within a very short time ($<1$ $\mu$s) the occurrence of a large number of simultaneous signal frequencies, which at the present state of the art is impossible with purely electronic methods. Moreover, optical spectrum analysers can be made very small and light.

Such spectrum analysers that exploit acousto-optic effects have been known for some years. One such analyser makes use of an acousto-optically controlled deflection of a collimated light field. The deflected light passes a transformation lens which focuses the light on to a diode matrix. As a rule, the latter is positioned in a plane in which the light from a source is guided (optical waveguide) and in which the lenses are waveguide lenses, preferably so-called geodesical lenses. The acousto-optical deflection is accomplished by means of a surface acoustic wave from a surface acoustic converter. A complete spectrum analyser of this kind may have the dimensions $15 \times 50$ mm.

A major disadvantage of this prior art analyser is that the geodesic lenses are difficult and costly to produce. A common method of producing them is by diamond turning in a lathe. Hitherto, it has not been possible to produce them with the aid of photolithographic technology which is used for the production of the component otherwise. This, in turn, means that the precision-demanding alignment of the optical components will be difficult.

A further disadvantage of the known spectrum analysers is that they have both a constant analysis time (T) and a constant bandwidth (B).

SUMMARY OF THE INVENTION

The object of the present invention is therefore to provide an integrated optical spectrum analyser which lacks both separate collimation lens and transformation lens but nevertheless performs these functions and which, moreover, does indeed have a fixed product of time and bandwidth ($T \times B$) but in which the analysis time or band width can be selected.

The present invention solves these problems. The integrated optical spectrum analyser comprises an optical radiation source connected to an optical waveguide. This waveguide is provided with an electro-optical deflector which, in turn, is furnished with an electrode matrix and is connected via electronic control circuits to the signal which is to be analysed. The spectrum analyser according to the invention also consists of a detection matrix connected to the waveguide.

The present invention is characterized in that the electrode matrix comprises a plurality of electrodes located in line, the electrodes having different widths and different spaces between them and of equal or different lengths. They are arranged with their longitudinal direction largely coinciding with the direction of the optical radiation incident from the radiation source and entering towards the deflector, the direction thus being largely at a right angle to the line. Further, the diode matrix is arranged after the electro-optical deflector, viewed in the propagation direction of the optical radiation. The elements of the detection matrix is then arranged to be disposed along a focal line, which is determined in position and direction by the parameters of the electrode configuration. A certain point in this focal line then corresponds to a given frequency of the signal to be analysed.

It has proved advantageous to allow the width of the electrodes, for example, as well as the spaces between them to vary quadratically along the line. This gives a lens effect on the part of the deflector appropriate to the purpose. It nevertheless presupposes that each electrode in the electrode matrix is supplied with a separate electrical signal voltage which is generated by the said electronic control circuits.

The source of radiation may be a laser diode which may be integrated in a waveguide or comprise an additional waveguide or an optical fiber which is optically connected to the waveguide of the spectrum analyser, which additional waveguide or fiber may be supplied by, for example, a laser diode.

The detection matrix may either comprise a pure detector matrix with the individual detectors disposed along the said focal line or of a series of channels, waveguides or fibers which commence at the focal line and at the other end of which a detector is provided for each and every one.

Finally, it is beneficial to permit the electrode matrix to be disposed in or in the vicinity of an active electro-optical material comprising the whole or a part of the waveguide layer of the waveguide in such a manner that the deflector is integrated with the optical waveguide to a single optical component. The latter shall then be produceable photolithographically in its entirety.

Although the most advantageous embodiment of the invention is that it is completely integrated in thin film technology, the principle of the present invention nevertheless also functions in bulk configurations.

A more detailed description of the invention is provided hereinafter, wherein reference is made to the accompanying FIGS. 1–4.

DESCRIPTION OF THE PREFERRED EMBODIMENT

Figure 1:
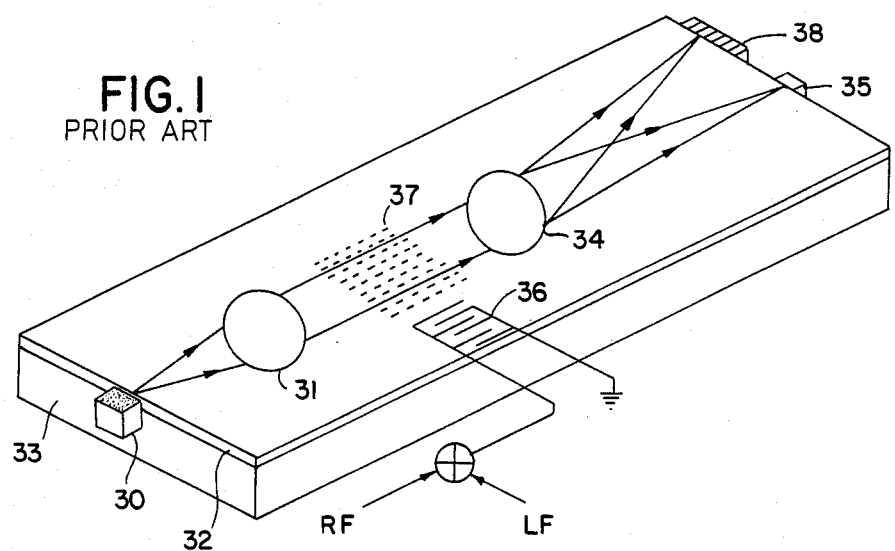
FIG. 1 shows a known optical spectrum analyser.

Illustrated in FIG. 1 is a principal sketch of a known spectrum analyser which exploits optical signal processing. In this device, the light is guided from a laser diode (30) to a collimating geodesic lens (31). The light guidance takes place in a waveguide (32) on a substrate (33). After the collimating lens (31), the now collimated light is guided towards a transformation lens (34) which interrupts the light and focuses it on to a reference detector (35). To the side of the collimated light there is a surface acoustic converter (36) which emits a surface acoustic wave (37) towards the collimated light. The converter has been excited with the voltage which is to be analysed in terms of frequency. If a voltage with a certain frequency drives the converter (36), a surface acoustic wave is formed having a wave length corresponding to this frequency. This causes a deflection of the collimated light with a specific angle. The deflected light is focused on to one of the units in a detection device (38).

The geodesic waveguide lenses are, in practice, only a few millimeters large and are very difficult to manufacture. Since they also have to be manufactured using a different technique than that employed to make other components, difficult alignment problems are encountered.

Figure 2:
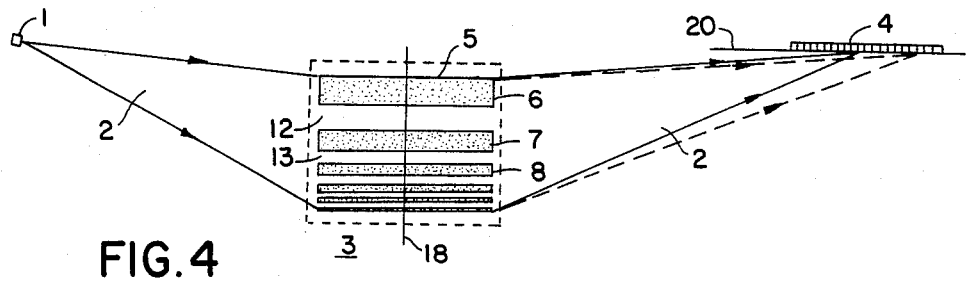
FIG. 2 illustrates the principle of a spectrum analyser according to the present invention.

Shown in FIG. 2 is a general arrangement sketch of a spectrum analyser according to the present invention. Here, the radiation is guided from the radiation source (1) in a waveguide (2) composed of a wave-guiding layer (21 in FIG. 4) a substrate on to an electro-optical deflector (3). The latter replaces both the collimating lens and transformation lens as well as the surface acoustic converter in the prior art arrangement according to FIG. 1. This deflector (3) includes an electrode matrix (5) arranged in or in the vicinity of an electro-optically active material, for example titanium-lithium-niobate which, at the same time, constitutes the waveguide (2). By permitting the electrode matrix (5) to includes electrodes (6-11) with different widths and arranged with different spaces (12-16) disposed along a line (18), the deflector (3) is found to obtain lens properties. By this means, it is not necessary for the incident light to be collimated, which excludes the demand for a collimating lens. Moreover, there is also no need for a transformation lens, since the deflector (3), through the choice of electroparameters, can be so structured that it is itself Fourier transforms the signal. Different frequencies (Fourier components) will then focus the light on different points along a focal line (20). For this reason, the detection matrix (4) with a plurality of detecting elements is disposed along the focal line (20) and consequently, a weighted spectrum at the detecting elements will be obtained. The appearance of the line (20) and its location depend on, among other factors, the configuration of the electrode matrix (5).

Figure 3:
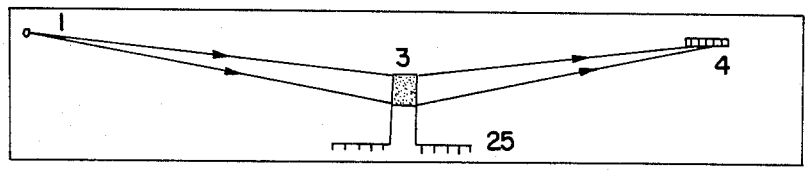
FIG. 3 shows an arrangement according to the invention in a more true-to-scale presentation and in which FIG. 4 finally, illustrates a cross-section of a deflector according to the invention.

FIG. 3 illustrates a spectrum analyser according to the present invention in more proper proportions. Here, the radiation source (1) emits radiation towards the deflector (3), the electrodes of which are connected to a supply network (25) which individually supplies it with voltage. After passing the deflector (3), the light is focused on the detection matrix (4).

Figure 4:
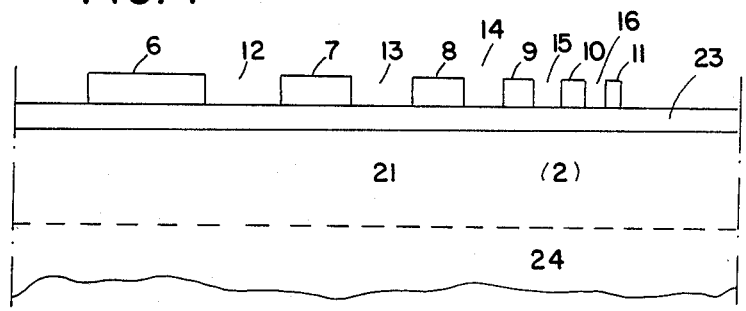

FIG. 4 finally, shows a section along a line (18) through a spectrum analyser according to the invention. The electrodes (6-11) are then disposed on an active medium (21) concurrently comprising the waveguide (2) on the substrate (24). The active medium may consist for example of titanium-lithium-niobate, whereas the substrate (24) may then for example consist of lithium-niobate. The buffer layer (23) serves to prevent the electrodes (6-11) from interfering with the waveguidance in the waveguide (21) which preferably is of variable index (graded index) type.

Although it is usually most advantageous to utilize the possibility of making the entire spectrum analyser according to the present invention in an integrated design, for example, by using photolithographic technique, the use of bulk technique is also within the inventive concept.

We claim:

1. An optical spectrum analyzer comprising:
   an optical radiation source;
   an optical waveguide made of an electro-optical material and coupled to receive radiation from said optical radiation source;
   a plurality of electrodes spaced apart on said waveguide along a line perpendicular to the direction of propagation of said radiation with their lengthwise dimension parallel to said direction of propagation, said electrodes having different widths and different spacing between each other, said radiation having an angular deflection in accordance with optical parameters provided by said electrodes, said electrodes and waveguide comprising an electro-optic deflector for deflecting incident radiation in accordance with an applied electric signal to be analyzed;
   a detection matrix disposed in said optical waveguide for receiving said radiation passing through said electro-optical deflector, said detection matrix including a sensing surface disposed along a focal line, which receives radiation from said electro-optical deflector, the position of incident radiation along said focal line being proportional to the frequency of said signal to be analyzed.

2. An optical spectrum analyser according to claim 1, wherein the width of the electrodes and the size of the spaces therebetween varies quadratically along the line perpendicular to said direction.

3. An optical spectrum analyser according to claim 1 or claim 2, whereby each electrode is excited by a separate electric signal voltage from electronic control circuits.

4. An integrated optical spectrum analyser according to claim 1, wherein the optical radiation is received from a laser diode.

5. An optical spectrum analyser according to claim 1, wherein the detection matrix comprises a pure detector matrix with the individual detectors disposed along the focal line.

6. An optical spectrum analyser according to claim 1, wherein the detection matrix includes a series of channels which commence along the focal line and terminate in an optical detector.

7. An optical spectrum analyser according to claim 1, wherein said waveguide is an electro-optically active material, and said electro-optical deflector is embedded in said active material, forming a single component manufactured by a photolithographic technique.

* * * * *